United States Patent
Kumagai et al.

[11] Patent Number: 6,165,595
[45] Date of Patent: Dec. 26, 2000

[54] COMPONENT MOUNTING BOARD, PROCESS FOR PRODUCING THE BOARD, AND PROCESS FOR PRODUCING THE MODULE

[75] Inventors: Koichi Kumagai, Ikoma; Yoshinori Wada, Moriguchi; Teruki Edahiro, Hirakata, all of Japan

[73] Assignee: Matsushita Electric Industrial Co., Ltd., Japan

[21] Appl. No.: 08/973,209

[22] PCT Filed: Apr. 7, 1997

[86] PCT No.: PCT/JP97/01189

§ 371 Date: Feb. 9, 1998

§ 102(e) Date: Feb. 9, 1998

[87] PCT Pub. No.: WO97/38562

PCT Pub. Date: Oct. 16, 1997

[30] Foreign Application Priority Data

Apr. 10, 1996 [JP] Japan ................................. 8-086970

[51] Int. Cl.[7] ...................................................... B32B 3/00
[52] U.S. Cl. ...................... 428/209; 174/260; 174/263; 29/831; 29/832; 29/843; 428/901
[58] Field of Search ...................... 428/209, 901; 174/260, 263; 29/832, 831, 843

[56] References Cited

U.S. PATENT DOCUMENTS

| | | | |
|---|---|---|---|
| 3,537,175 | 11/1970 | St. Clair et al. | 427/282 |
| 3,978,375 | 8/1976 | Fukui et al. | 317/101 C |
| 4,846,922 | 7/1989 | Benge et al. | 156/324 |
| 4,949,155 | 8/1990 | Tajima et al. | 174/255 |
| 4,965,933 | 10/1990 | Mraz et al. | 29/882 |
| 5,118,556 | 6/1992 | Makino et al. | 428/901 |
| 5,158,818 | 10/1992 | Aurichio | 428/901 |
| 5,196,268 | 3/1993 | Fritz | 428/901 |
| 5,328,752 | 7/1994 | Miyazato | 428/901 |
| 5,362,547 | 11/1994 | Yamazaki | 428/901 |

FOREIGN PATENT DOCUMENTS

| | | |
|---|---|---|
| 0 312 415 A1 | 4/1989 | European Pat. Off. . |
| 61-243671 | 10/1986 | Japan . |
| 3-57291 | 3/1991 | Japan . |
| 7-226574 | 8/1995 | Japan . |

*Primary Examiner*—Cathy F. Lam
*Attorney, Agent, or Firm*—Parkhurst & Wendel, LLP

[57] ABSTRACT

A parts-packaging substrate comprising a metal wiring plate having a mask coated on its surface with several openings. This structure eliminates the need for a thick base formed of an insulating body and a resist layer required in prior art substrates. By bending a terminal of the metal wiring plate to form a connecting terminal, a connector used to connect to another substrate can be eliminated, reducing the cost of manufacture.

7 Claims, 7 Drawing Sheets

FIG.4(a)
FIG.4(b)
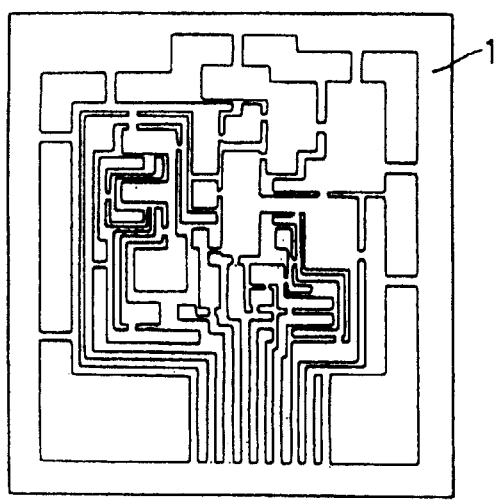
FIG.4(c)
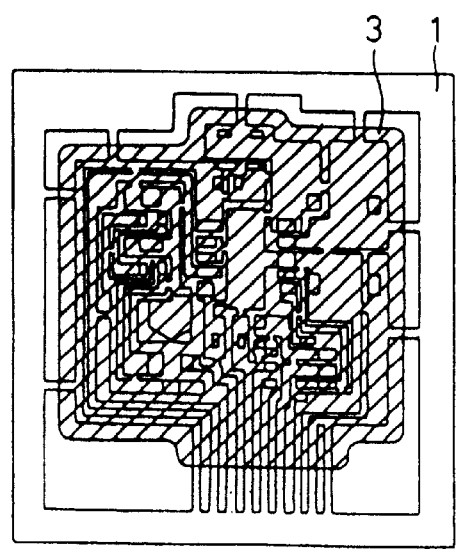
FIG.4(d)
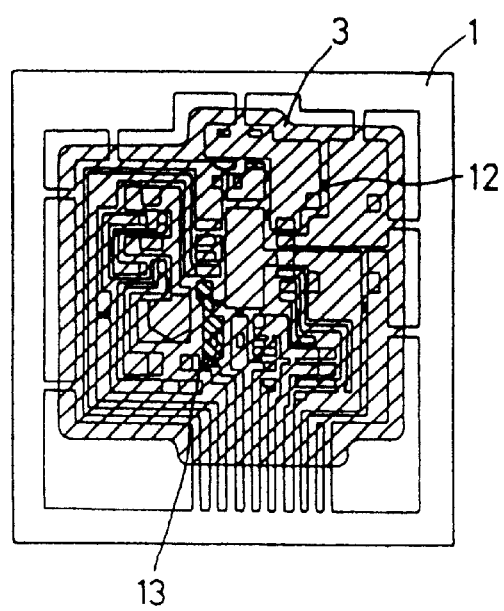

6,165,595

COMPONENT MOUNTING BOARD, PROCESS FOR PRODUCING THE BOARD, AND PROCESS FOR PRODUCING THE MODULE

FIELD OF THE INVENTION

The present invention relates to a parts-packaging substrate and a method for manufacturing the same as well as a method for manufacturing a module.

BACKGROUND ART

Conventionally, a parts-packaging substrate a paper phenol substrate, a coppered laminate resin substrate such as paper phenol substrate and glass epoxy substrate, and a ceramic substrate or a metal substrate. FIG. 7 shows a structural example of the prior art.

In every case, a metal wiring layer 23 with a desired pattern applied thereto is formed on the surface of an insulating substrate 22 and a resist layer 24 is formed on part of the surface of the metal wiring layer 23 exposed so as to match the electrodes of electronic parts.

A method for manufacturing a coppered laminate resin substrate comprises forming a desired pattern by the electrochemical etching to make a metal wiring layer after bonding a copper foil to the surface of an insulating substrate 22 serving as a base. Then, resin serving as a resist layer 24 is printed by using a screen mask or the like and hardened.

Material examples of the insulating substrate 22 are a paper-based phenol resin impregnated substrate or a glass-textile-based epoxy resin impregnated substrate. The copper foil is prepared by electrolysis and rolling. The representative thickness is 0.2–1.6 mm for an insulating substrate 22, 0.009–0.05 mm for a metal wiring layer 23 and 0.005–0.05 mm for a resist layer 24.

In a method for manufacturing a metal substrate, aluminum or steel is used as an insulating base material 22, a copper layer is formed by sticking a copper foil on the surface or by plating after the insulating treatment of the surface, a metal wiring layer 23 subjected to a desired patterning by the electrochemical etching is formed and next a resist layer 24 is formed by the printing.

The representative thickness is 0.4–2.0 mm for an insulating base material 22 serving as the base, 0.01–0.2 mm for a metal wiring layer 23 and 0.005–0.05 mm for a resist layer 24.

A method for manufacturing a ceramic substrate comprises the steps of printing a paste onto a base material such as $Al_2O_3$ in accordance with a desired pattern by using a screen mask which is prepared by kneading metal powder and glass powder with resin such as ethyl cellulose and a solvent such as terpineol as an insulating base material 22 serving as a base, evaporating or burning the resin and solvent by sintering at a temperature of 600–900° C., securing the remaining metal powder and glass powder on the base material by fusion or sintering to thus form a metal wiring layer 23 and then forming a resist layer 24.

The representative thickness is typically 0.5–1.5 mm for a ceramic substrate serving as the insulating base material 22 and 0.005–0.05 mm for a metal wiring layer 23.

Since there is an insulating base material serving as the thick base for forming the metal wiring layer and a. resist layer, however, a conventional parts-packaging substrate as mentioned above problems that the manufacturing cost is high and is dependent on the price of an insulating base material serving as the base.

In addition, the connection to another substrate present an additional problem in that it is necessary to join a connector terminal as another part onto the parts-packaging substrate and then to connect the substrates to each other via the connector, increasing the total cost.

Thus, it is the object of the present invention. to provide a parts-packaging substrate which can be manufactured while omitting an insulating base material serving as the base or by using a simple substrate base and which needs no other parts for connection with other substrates, a method for manufacturing the same, and a method for manufacturing a module.

SUMMARY OF THE INVENTION

A parts-packaging substrate according to an embodiment of the present invention comprises a metal wiring plate patterned so as to electrically connect the electrodes of a plurality of parts to each other and a mask film coated so as to cover the end face of the metal wiring plate in which openings corresponding to the electrodes of the parts are formed.

According to the above arrangement of a parts-packaging substrate, the base substrate in a conventional example is unnecessary but the use of a simple mask film is only necessary.

A parts-packaging substrate according to another embodiment of the present invention comprises a metal wiring plate in a parts-packaging substrate wherein holes for inserting the lead electrodes of parts are machined and a mask film coated on the side opposite to that of insertion of parts is formed with soldering openings of larger diameters than the inside ones of the insertion openings at substantially corresponding positions to the insertion holes.

According to the above arrangement of a parts-packaging substrate, the base substrate of the conventional example is unnecessary, and because the presently claimed invention discloses soldering, openings are formed in the coated mask film, soldering after the insertion of lead electrodes in parts can also be implemented without hindrance.

A method for manufacturing a parts-packaging substrate according to the present invention comprises the steps of:
 fabricating a metal wiring plate by partially removing the metal plate chemically or physically into a desired pattern; coating the metal wiring plate with a mask film in which openings are provided corresponding to the positions of mounting parts in the desired pattern; and fabricating a separated electrode part not electrically connected by removing a part of the metal wiring plate after the coating of the mask film.

According to the above method for manufacturing a parts-packaging substrate, in a pattern for the electrical connection between a plurality of parts, the formation of a separated electrode not electrically connected is indispensable to freely design a circuit or a wiring pattern without restriction to applicable electronic circuit, and the manufacturing of such separated electrode section can be easily implemented.

A method for manufacturing a parts-packaging substrate according to the present invention is a method according to wherein the mask film is peeled off after the packaging and electrically connecting the parts.

According to the above method for manufacturing a parts-packaging substrate, a mask film to be peeled off is usable only for purposes of providing retention and fixation of the separated electrode till the packaging of parts, and it is sufficient to select the material and characteristics fitted only for the purposes. Thus, by adopting a thin and inexpensive material, the obtained substrate becomes inexpensive.

A method for manufacturing a parts-packaging substrate according to of the present invention is a method further comprising the steps of: coating a mask film made up of a thermosetting resin prepreg to a metal wiring plate; removing at least one part of the metal wiring plate and part of the mask film; and hardening the resin by heating the mask film.

According to the above method for manufacturing a parts-packaging substrate, it becomes possible to more firmly support and fix the metal wiring plate owing to the resin curing through aids of heating the mask film.

A method for manufacturing a parts-packaged module according to the present invention comprises the steps of: fabricating a mask film by perforating a continuous tape-shaped film; fabricating a metal wiring plate by press stamping a continuous tape-shaped metal plate; fabricating a continuous body of circuit substrates by coating the mask film and the metal wiring plate to each other; packaging and joining parts onto the continuous body of circuit substrates; and separating a parts-packaged module from the continuous body.

According to the above method for manufacturing a parts-packaging module, an effect of productivity is enhanced by processing and coating both the metal wiring plate and mask film in the shape of a continuous tape, and an effect of greatly reducing the manufacturing cost is achieved by performing a packaging and joining of parts on the continuous circuit board and then separating it into individual boards of the parts-packaged module.

A method for manufacturing a parts-packaged module according to the present invention comprises the steps of: placing and fixing individual metal wiring plates patterned on a continuous tape-shaped film; conveyance-positioning and fixing by using holes or marks provided on the continuous tape-shaped film; and packaging and joining parts on the individual metal wiring plates.

According to the above method for manufacturing a parts-packaging module, the positioning fixation for conveyance is performed by using a continuous tape-shaped film, so that the metal wiring plate can be of a minimum size and such spaces as for gripping, fixation, and hole machining or mark forming, which have conventionally been required for the positioning fixation for conveyance, become unnecessary.

BRIEF DESCRIPTION OF THE DRAWINGS

FIGS. 4(a)–4(d) show a manufacturing processes of a parts-packaging substrate according to Embodiment 2;

DISCLOSURE OF THE PREFERRED EMBODIMENTS

Referring to FIGS. 1 to 6, the arrangement of a parts-packaging substrate and a method for manufacturing the same as well as a method for manufacturing a module will be described.

(Embodiment 1)

Figure 1:
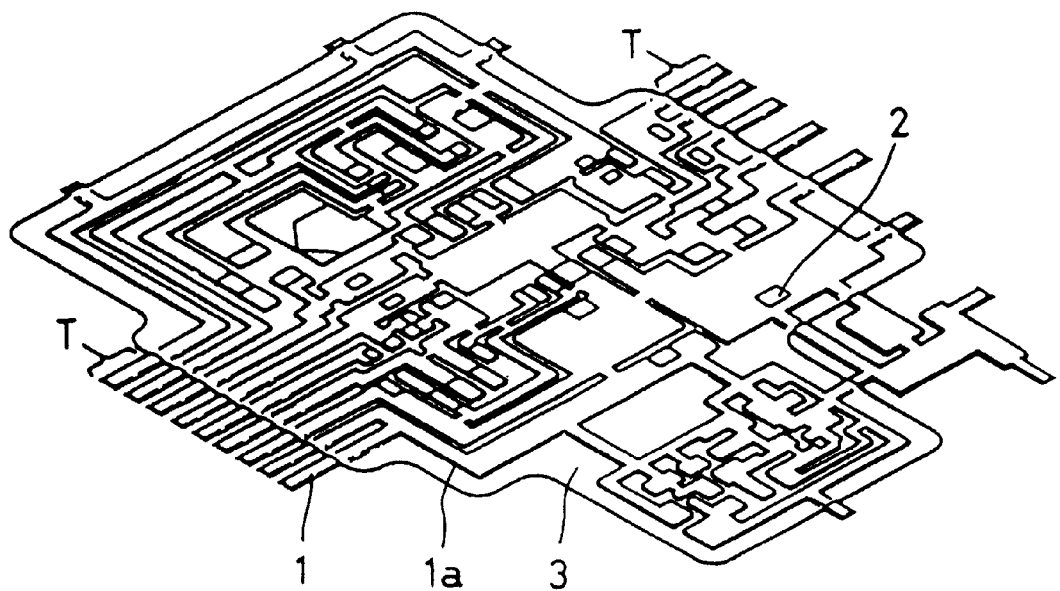
FIG. 1 is a perspective view showing a parts-packaging substrate according to Embodiment 1.

FIGS. 1 and 2 show Embodiment 1.

Figure 2A:
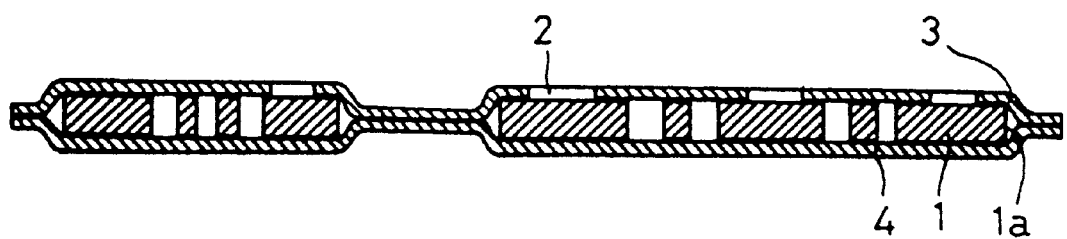
FIGS. 2(a)–2(c) are sectional structural views showing a parts-packaging substrate according to Embodiment 1.

First, a parts-packaging substrate according to the embodiment shown in FIG. 1 and FIG. 2(a) comprises a metal wiring plate 1 subjected to a patterning by means such as press stamping or electrochemical etching and a mask film 3, 4 coated to the surface of the metal wiring plate 1 so as to cover the end face 1a of the metal wiring plate 1. On the mask film 3, openings 2 matching the electrodes of electronic parts are formed.

Figure 2B:
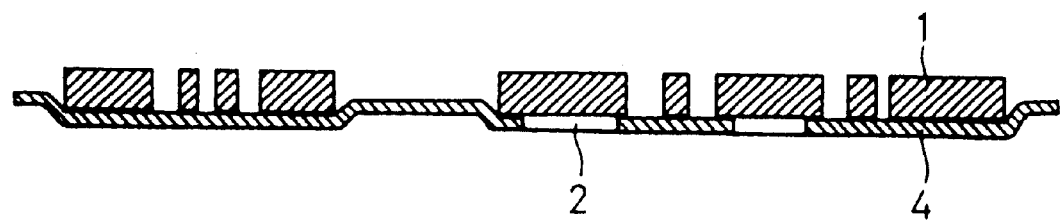

With the embodiment shown in FIG. 2(b), the mask film 4 is disposed on one face and openings 2 matching the electrodes of electronic parts are formed in the mask film 4.

Figure 2C:
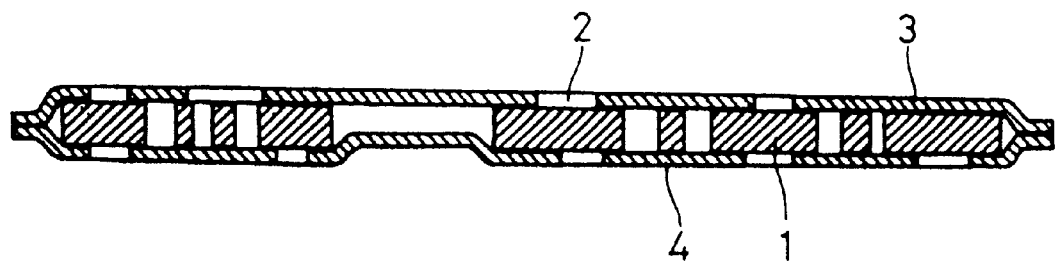

With the embodiment shown in FIG. 2(c), the mask films 3, 4 are disposed on both faces of the metal wiring substrate 1 and openings 2 matching the electrodes of electronic parts are provided in both the mask films 3 and 4.

Here, a 0.5±0.01 mm thick phosphor bronze plate was employed as the metal wiring plate 1 but the thickness is optional as being 0.05 mm, 0.2 mm, 0.7 mm and 1.5 mm. Besides, needless to say, pure copper, 42 alloy tin-plated steel plate, other various metals such as aluminum and their surface-treated materials can be used as a material.

Besides, for mask films 3, 4, paper-based polyamide-impregnated resin made into a film is employed. The thickness of the film is 0.05 mm±0.015 mm and adhesives are applied to one face side of the film for a thickness of about 0.005 mm.

Like this, a metal wiring plate 1 subjected to a patterning by means such as press stamping or electrochemical etching so as to electrically connecting the electrodes of electronic parts to each other assumes a structure that a mask film 3 is disposed on one face or a structure that mask films 3, 4 are disposed on both faces, requiring no insulating base 22 which has been required in a conventional example. Thus, use of only a simple mask film is necessary.

Accordingly, manufacturing of parts-packaging substrates lower in cost than the conventional ones is facilitated. Furthermore, since the press stamping can be utilized for the patterning of a metal wiring substrate 1, a further cost reduction becomes possible and the productivity is also high. Besides, forming of openings 2 in the mask films 3, 4 enables the packaging of electronic parts to be implemented, and coating a mask film 3 or mask films 3,4 so as to cover the end face of a metal wiring plate 1 eliminates a problem caused by external physical disturbance and secures the insulation between wirings.

In FIGS. 1 and 2, the portion T protruding outward from the mask film 3, 4 of the metal wiring plate 1 acts as terminal portion for the connection to an external circuit when this parts-packaging substrate is used to make a parts-packaged module. When bent as required, this portion T can be used in place of a connector terminal to the substrate to be packaged with a parts-packaging module, and can be connected to an external circuit without joining a connector terminal as a separate portion onto the parts-packaging substrate.

(Embodiment 2)

Figure 3:
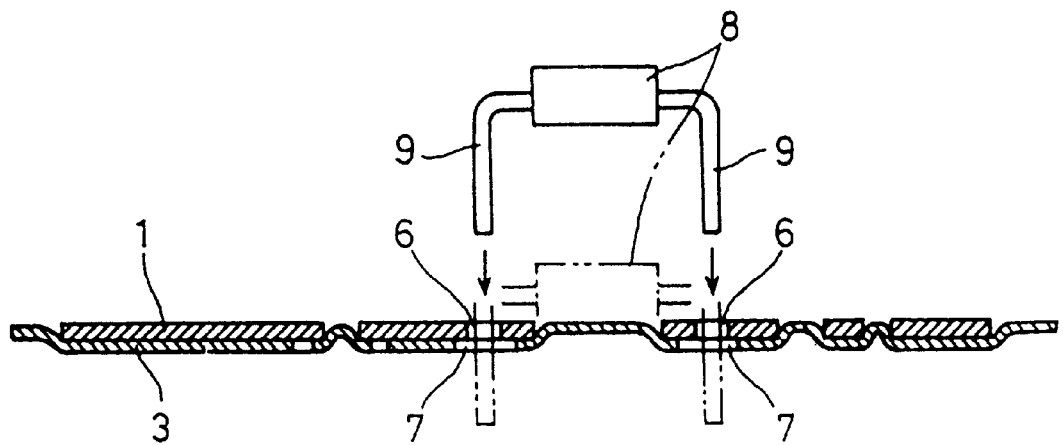
FIG. 3 is a sectional structural view showing a parts-packaging substrate according to Embodiment 2.

FIG. 3 shows Embodiment 2.

In a parts-packaging substrate according to Embodiment 2, a mask film 3 is coated onto one face of a metal wiring plate 1 and holes 6 are previously machined in the metal wiring plate 1 so that lead electrodes 9 of electronic parts 8 can be inserted therein. On the mask film 3, soldering openings 7 are formed corresponding to the holes 6 of the metal wiring plate 1, the diameter of the soldering openings 7 being larger than that of the holes 6. The prearranged direction of insertion of the lead electrodes 9 of electronic parts 8 is opposite to the coated face of the mask film 3.

To be specific, machining has been made, setting the outside diameter of the lead electrode 9 as φ0.6±0.02 mm, the inside diameter of the hole 6 as φ1.0±0.05 mm and the inside diameter of the soldering opening 7 as φ03.0±0.15 mm. Here, the material composition of the metal wiring plate 1 and that of the mask film 3 are the same as those in Embodiment 1.

According to this parts-packaging substrate, the holes 6 for the insertion of lead electrodes of electronic parts are machined in the metal wiring plate 1 and the coated face of the mask film 3 and the inserted face of electronic parts are opposed to each other in positional relation, thus eliminating the need for an insulating base 22 as in the conventional packaging substrate. Thus, a further reduction in the costs of manufacturing of parts-packaging plates than the conventional is facilitated.

Besides, on the coated mask film 3, the soldering openings 7 having a larger diameter than the inside diameter of the holes 6 in the metal wiring plate 1 are formed, so that soldering after the insertion of the lead electrodes of electronic parts can be implemented without hindrance.

This parts-packaging substrate shown in FIG. 3 is manufactured in accordance with the manufacturing steps shown in 4(a)–4(b). Incidentally, in FIG. 3, the mask film 3 is illustrated with hatching.

First, a metal plate 10 as shown in FIG. 4(a) was stamped by using a press mold so as to make it into a desired pattern and a metal wiring plate 1 as shown in FIG. 4(b) was prepared.

Next, as shown in FIG. 4(c), a mask film 3 with openings 7 previously formed so as to match a desired pattern was coated onto the surface of the metal wiring plate 1. At that time, heat and pressure, each about 70° C. and about 50 kgf/cm$^2$ were applied for about 10 minutes to promote the close adhesion.

Then, to form a separated electrode 13 as shown in FIG. 4(d), the metal wiring plate 1 and the mask film 3 were partially stamped simultaneously by using a press mold at the position of a removal portion 12 of the metal wiring plate 1. Cutting is also possible by using $CO_2$ laser, a leutor or the like. As a result, the separated electrode portion 13 is so arranged as not to be connected to any metal wiring.

In a pattern to electrically connect the electrodes of a plurality of electronic parts, applicable electric circuits are not restricted, and in order to freely design circuits and wiring patterns, forming of a separated electrode portion is indispensable. According to the above method for manufacturing a parts-packaging substrate, there is provided an effect that such a separated electrode portion can be easily manufactured. Accordingly, manufacturing of inexpensive and highly practical parts-packaging substrates becomes possible.

Incidentally, the manufacturing method shown in FIG. 4 is effective not only for manufacturing the parts-packaging substrate shown in FIG. 3 but also for manufacturing any parts-packaging substrate shown in FIGS. 2(a) to 2(c).

(Embodiment 3)

FIG. 5 shows Embodiment 3.

This method for manufacturing a parts-packaging substrate is characterized in that a mask film 3 is peeled off from the metal wiring plate 1 after electronic parts are packaged and electrically connected. To be specific, in case of a parts-packaging substrate having mask films 3 and 4 coated on both faces of the metal wiring plate 1 as shown in (a) of FIG. 5(a), after electronic parts 8a and 8b are placed on the metal wiring plate 1 of the parts-packaging substrate by using an adhesive 15 and the electrodes are joined with soldering 14, the mask film 3 coated on a face opposed to the packaged face of the electronic parts is peeled off in the direction of the arrow X to make a parts-packaged module.

Figure 5A:
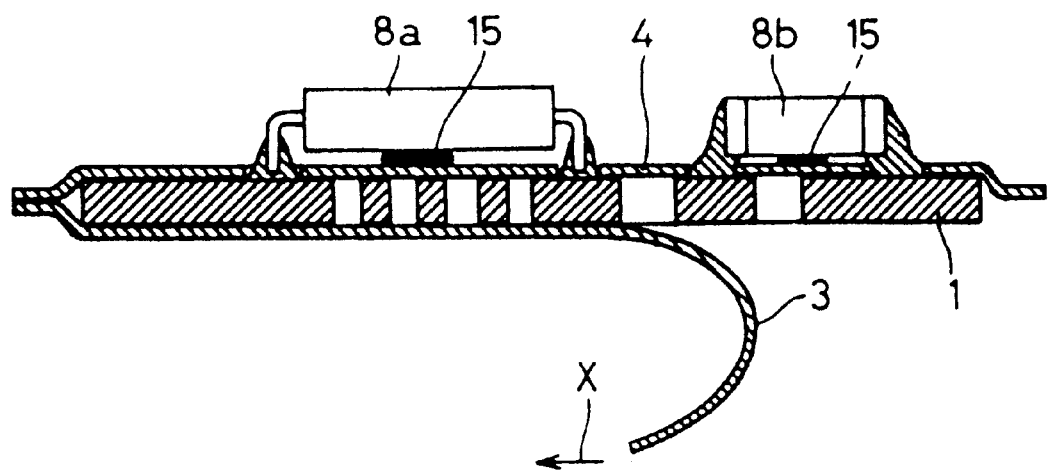
FIGS. 5(a)–5(b) are sectional structural views of a parts-packaging substrate showing a method for manufacturing the same according to Embodiment 3.
Figure 5B:
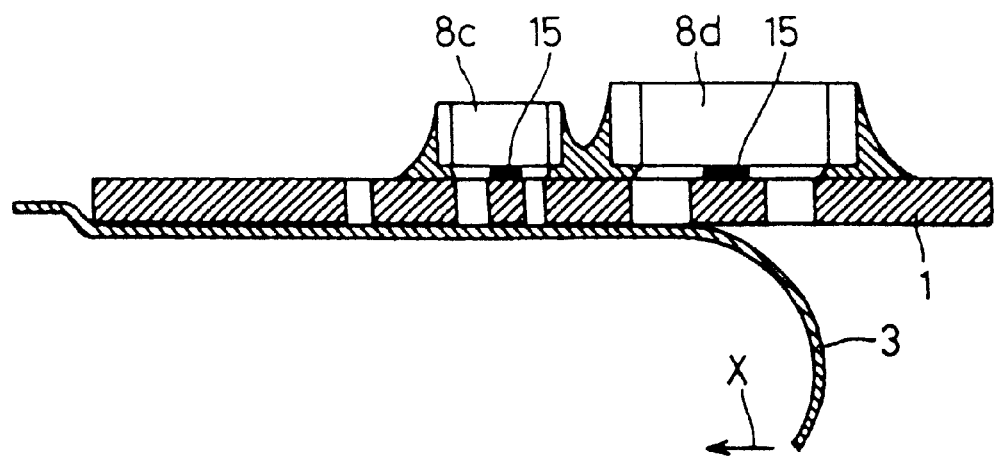

Similarly, as shown in FIG. 5(b), in case of a parts-packaging substrate having a mask film 3 coated only on the face opposite to the packaging face of electronic parts in the metal wiring plate 1, after electronic parts 8c and 8d are placed on the metal wiring plate 1 of the parts-packaging substrate by using an adhesive 15 and the electrodes are joined with soldering 14, the mask film 3 is peeled off in the direction of the arrow X.

According to this method for manufacturing a parts-packaging substrate, the mask film 3 peeled off after the packaging of electronic parts is used only to serve for the retention and fixation of a separated electrode portion 13 until the packaging is completed, and it is sufficient to consider the purpose alone in selecting materials and properties of the film. In other words, with a parts-packaging substrate according to each of the Embodiments 1 to 2 mentioned above, it was necessary for fulfilling the function as an electric circuit after the packaging of portions that the mask film 3 be provided with electrically good insulation, corrosion resistance and other characteristics, whereas none of such characteristics is needed according to this method for manufacturing a parts-packaging substrate because the mask film is peeled off and removed after the packaging of parts. Consequently, adopting a thin film of inexpensive material becomes possible and a greater cost-saving is achieved than according to Embodiments 1 and 2.

(Embodiment 4)

FIG. 6 shows Embodiment 4.

Figure 6A:
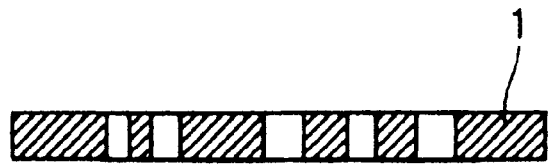
FIGS. 6(a)–6(d) are sectional structural view showing the manufacturing process of a parts-packaging substrate according to Embodiment 4.
Figure 6B:
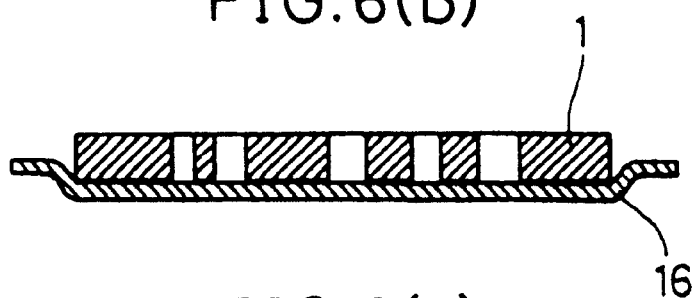

This method for manufacturing a parts-packaging substrate is manufactured in accordance with the manufacturing steps shown in FIG. 6(a)–6(d). In manufacturing a parts-packaging substrate according to each of the Embodiments 1 to 3 mentioned above, a metal wiring plate 1 subjected to a desired patterning as shown in FIG. 6(a) is prepared and then a mask film 16 comprising a prepreg of thermosetting resin is coated onto the metal wiring plate 1 as shown in FIG. 6(b).

As a mask film 16, a prepreg film impregnated with paper-based phenol resin is used. The film thickness is 0.2±0.03 mm and a mask film 16 is coated onto the metal wiring film 1 under conditions of 80° C. and 10 kgf/cm$^2$.

Other materials available for a mask film 16 include a paper-based epoxy resin-impregnated prepreg film and a glass texture epoxy resin-impregnated prepreg film, all of which do not injure the effect of the present invention at all.

Figure 6C:
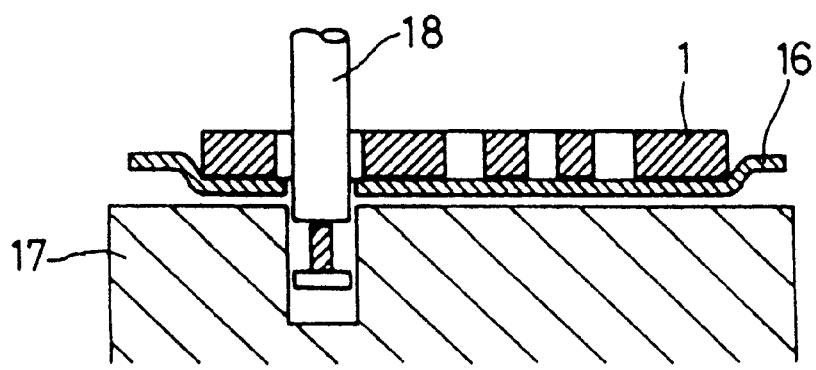

Then, as shown in FIG. 6(c), part of the metal wiring plate 1 is stamped collectively for each mask film 16 by using a female die 17 and a stamping punch 18 to form a separated electrode 13 according to Embodiment 2.

Figure 6D:
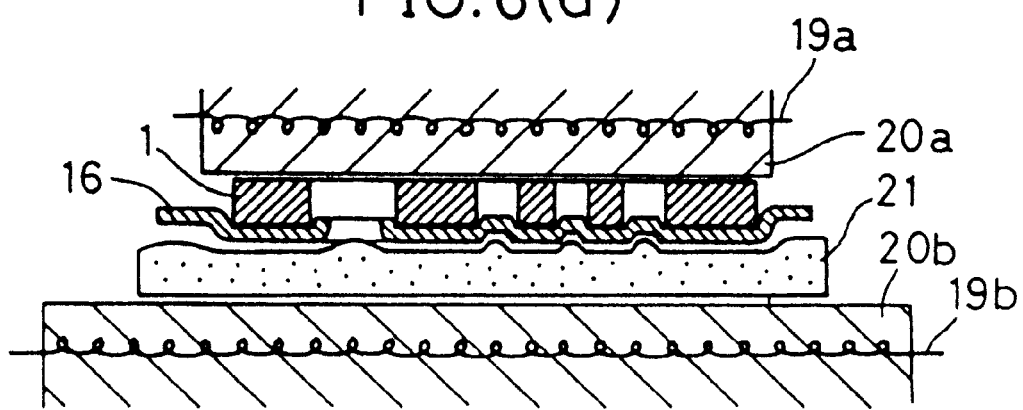
Figure 7:
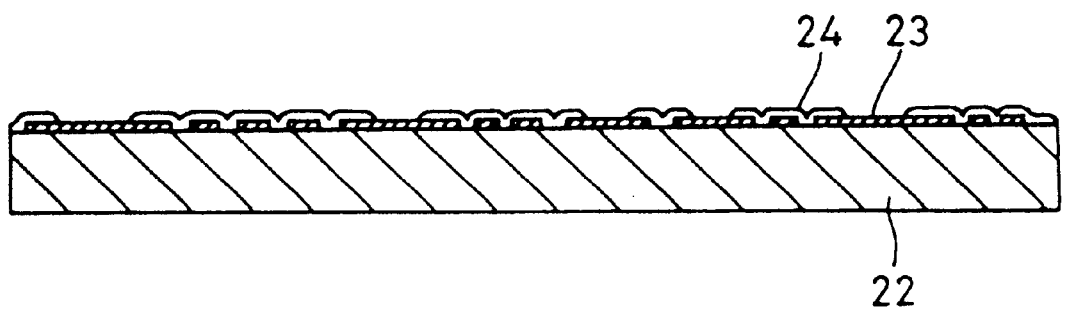
FIG. 7 is a sectional structural view of a conventional parts-packaging substrate.

Next, as shown in FIG. 6(d), the metal wiring plate 1 and the mask film 16 processed in FIG. 6(c) are interposed between a heater 19a built-in male die 20a and a heater 19b built-in female die 20b, and heated, whereby the resin composing a mask film 16 is heat-hardened. Incidentally, this heating is executed with a cushion sheet 21 interposed between the mask film 16 and the heating female die 20b under some pressure, thereby improving adhesion of the mask film 16 to the metal wiring plate 1. The temperature and pressure of the heating male die 20a and of the heating female die 20b was respectively set at 230° C. and 120 kgf/cm$^2$, and the resin was hardened under the peak temperature and pressure for 3 hours.

The fabricated parts-packaging substrate indicated an insulating resistance value of $1.5 \times 10^{12}$ 106 by a comb-shaped electrode of 1.54 mm pitch and an adhesion value of $-1.35 \pm 0.33$ kgf/cm² (tape peeling method) obtained by measuring an adhesion force of the mask film 16 to the metal wiring plate 1, thus providing satisfactory characteristics as a parts-packaging substrate for constituting an electronic circuitry.

According to this Embodiment where part of the metal wiring plate 1 and part of the mask film 16 are removed, forming an opening in a portion of the mask film 16 corresponding to a separated electrode 13 or the like may result in need only for the removal of part of the metal wiring plate 1 alone. Besides, there are some cases where a metal-free portion of the metal wiring plate 1 is stamped and only a part of the mask film 16 is removed.

(Embodiment 5)

A method for manufacturing a parts-packaged module according to this embodiment includes three methods for manufacturing a parts-packaging substrate respectively according to previously described embodiments, and is a method of consistently performing the packaging and joining of electronic parts to complete a product as the parts-packaged module.

Either the mask film 3 or the mask films 3 and 4 and the metal wiring plate 1 subjected to press stamping are both formed in the shape of a continuous tape, and the boring of openings 2 and 7 and the like and the press stamping of the metal wiring plate 1 enable execution of the conveyance, support, positioning and fixation in the shape of the respective continuous tapes.

Furthermore, a mask film is coated onto the metal wiring plate to fabricate a continuous body of metal wiring plates 1, next electronic parts are packaged and joined on the continuous body of circuit substrates, thereafter the metal portion and film part are stamped, cut and bent, whereby each individual parts-packaged module is separated from the continuous body of circuit substrates and brought to completion.

In a conventional method according to which individual pieces, not in a continuous body, are machined, a unit mechanism of conveyance, support, positioning and fixation, and the like is needed, whereas this method for manufacturing a parts-packaging module is based on the machining of circuit substrates in a state of the above-mentioned continuous body. Thus, according to the present invention, a manufacturing method requiring none of such unit mechanism can be implemented. Besides, a more rapid machining is facilitated than in the state of individual pieces and consequently the productivity rises. In any way, the manufacturing that permits cost-saving becomes possible.

And yet further, by the stamping in separation and bending in cutting, the respective connection portions between metal portions and metal wiring plates in the shape of a continuous tape are machined into a shape usable as connection terminals to other substrates, so that the effect of needing no other portions such as connector portions are obtained and consequently a further cost-saving can be achieved.

Incidentally, in manufacturing a final parts-packaged module having mask films 3 and 4 coated onto the metal wiring plate 1, as shown in FIG. 2(a) and 2(c), it is possible to choose either a manufacturing method in which both mask films 3 and 4 are made into the shape of a continuous tape and coated onto the continuous tape-shaped metal wiring plate 1 interposed between these continuous tape-shaped mask films 3 and 4, or a manufacturing method in which one of the mask films 3 and 4, e.g., the mask film 4, is made into the shape of a continuous tape, and the other one, i.e., the mask film 3 in this case, is made into individual film pieces for each parts-packaged module, and then these individual film pieces are coated onto one face of a continuous tape-shaped wiring plate 1 having a continuous tape-shaped mask film 4 coated on the other face.

(Embodiment 6)

A method for manufacturing a part-packaged module is not described, wherein a metal wiring plate is made into individual pieces and a continuous tape-shaped mask film uses individual pieces of the metal wiring plate as carriers for conveyance, positioning and fixation. In machining a metal wiring plate made into the shape of a continuous tape, blank portions for conveyance, positioning and fixation become necessary. Since the metal wiring plate is higher in material cost than the mask film, blank portions are provided in the mask film and the metal wiring plate is individualized so as to enable the area and the material procurement to be minimized. Thus, a low-cost manufacturing is made possible.

To be specific, in manufacturing a final parts-packaged module having a mask film 4 coated onto one face of the metal wiring plate 1 as shown in FIG. 2(b), individualized pieces of the metal wiring plate 1 are placed at predetermined intervals and coated onto a continuous tape-shaped mask film 4, electronic parts are packaged and joined and thereafter every parts-packaged module is separated. In this case, it is possible to select either one of the following methods: a method of stamping, cutting and bending the metal wiring plate 1 and the mark film 4, and separating them into individual parts-packaged modules; or a method of stamping, cutting and bending only the mask film 4, and separating it into individual parts-packaged modules.

When a parts-packaged module finished by coating the mask films 3 and 4 on the metal wiring plate 1 is to be manufactured as shown in FIGS. 2(a) and 2(c), it is possible to choose either a manufacturing method by coating mask films 3 and 4 onto individualized metal wiring plate pieces 1 interposed at predetermined intervals between these continuous tape-shaped mask films 3 and 4, packaging and joining electronic parts and thereafter separating every parts-packaged module, or a manufacturing method by placing individualized metal wiring plate pieces 1 at predetermined intervals on a continuous tape-shaped mask film 4, further cover it with film pieces of the mask film 3 for each parts-packaged module portion to coat the mask films 3 and 4 onto the metal wiring plate 1, packaging and joining electronic parts thereon and thereafter separating each parts-packaged module. In this case, it is possible to choose either a manner in which every parts-packaged module is separated after stamping, cutting or bending the metal wiring plate 1 and a mask film 3 or mask films 3 and 4, or a manner in which every parts-packaged module is separated after stamping, cutting or bending mask films 3 and 4 or a continuous tape-shaped mask film 4 alone.

Industrial Applicability

As described above, a parts-packaging substrate and a method for manufacturing the same as well as a method for manufacturing a parts-packaged module according to the present invention are very effective to simplify the manufacturing steps and to realize cost savings of manufacturing a parts-packaging substrate or a parts-packaged module by using the parts-packaging substrate.

What is claimed is:

1. A parts-packaging substrate comprising:
   a metal wiring plate patterned to electrically connect electrodes of a plurality of parts; and a mask film covering a surface of said metal wiring plate, wherein said mask film has openings corresponding only to a plurality of positions for mounting the electrodes of the plurality of parts.

2. A parts-packaging substrate according to claim 1, wherein said metal wiring plate has a plurality of holes therein for inserting said electrodes from the plurality of parts, said mask film covers a lower surface of said wiring plate opposite a top surface of said wiring plate on which said plurality of parts are mountable;

wherein said openings are adapted to receive solder and have a diameter larger than the holes in said metal wiring plate, and locations of said openings correspond to positions of said holes.

3. A method for manufacturing a parts-packaging substrate comprising:

partially removing a portion of a metal plate by at least one of a chemical and physical process into a desired pattern to fabricate a metal wiring plate;

coating said metal wiring plate with a mask film, said mask film including openings corresponding only to a plurality of positions for mounting a plurality of parts in said desired pattern; and removing a portion of said metal wiring plate and a corresponding portion of said mask film to provide a separated electrode part not electrically connected with the plurality of parts.

4. A method for manufacturing a parts-packaging substrate according to claim 3, further comprising the steps of packaging and electrically connecting the plurality of parts onto a packaging substrate, and peeling off said mask film from said metal wiring plate after packaging and electrically connecting the plurality of parts onto the packaging substrate.

5. A method for manufacturing a parts-packaging substrate according to claim 3, further comprising:

coating a mask film of a thermosetting resin prepeg on to said metal wiring plate; and hardening the thermosetting resin by heating said mask film.

6. A method for manufacturing a parts-packaged module comprising:

fabricating a mask film by perforating a continuous tape-shaped film to form openings corresponding to a plurality of positions for mounting electrodes of parts;

fabricating a metal wiring plate by press stamping a continuous tape-shaped metal plate;

fabricating a continuous body of circuit substrates by coating said metal wiring plate with said mask film so as to match the mask film openings with the positions for mounting the electrodes;

packaging and joining parts onto said continuous body of circuit substrates; and separating a parts-packaged module from said continuous body.

7. A method for manufacturing a parts-packaged module comprising:

placing and fixing individual metal wiring plates patterned onto a continuous tape-shaped film;

conveyance-positioning and fixing parts to be packaged by placing said parts on at least one of holes and marks provided on said continuous tape-shaped film; and packaging and joining parts on said individual metal wiring plates.

* * * * *